May 24, 1960 C. Z. LE MAY 2,937,439

METHOD OF MAKING OHMIC CONNECTIONS TO SEMICONDUCTOR DEVICES

Filed Nov. 21, 1956

INVENTOR

Charlotte Z. LeMay

BY Stevens, Davis, Miller & Mosher

ATTORNEYS 2,937,439

METHOD OF MAKING OHMIC CONNECTIONS TO SEMICONDUCTOR DEVICES

Charlotte Z. Le May, Dallas, Tex., assignor to Texas Instruments Incorporated, Dallas, Tex., a corporation of Delaware Filed Nov. 21, 1956, Ser. No. 623,660

6 Claims. (Cl. 29—492)

This invention relates to improvements in ohmic connections for silicon semiconductor devices and to a method for making such connections.

Typical of silicon semiconductor devices are silicon transistors which are comprised of a small bar of silicon about .030 by .030 inch in cross-section and about .25 inch in length. This small silicon bar has end portions of one type (p or n) of electrical conductivity and a narrow layer extending transversely somewhere near the mid-point of the opposite type of electrical conductivity. Electrical connections must be made to this intermediate layer, which is known as the base of the transistor, and to the end portions, which are known as the emitter and the collector of the transistor. Provisions for supporting and enclosing the bar are also provided.

This invention is concerned with the making of the connections to the ends of the silicon transistor bar, and since no rectification of the electrical current is desired at these points, these connections are known as ohmic or non-rectifying connections. The connection that must be made to the base layer of the bar presents its own peculiar problems, but this invention is not concerned with them.

Prior to this invention, many different methods of forming the ohmic connections at the ends of silicon transistor bars have been proposed and some of them have been commercially used. However, considerable difficulty has been encountered in making these connections because it is difficult to get any type of solder to stick to silicon; high temperatures tend to injure or destroy the very characteristics that it is necessary for the silicon bars to have in order for them to function as transistors; and silicon has a relatively low coefficient of expansion, whereas most metals have a much higher coefficient of expansion, so that changes in temperature of the device normally encountered in the course of affixing the ohmic contacts to the silicon bar tend to cause the contact to crack loose from the silicon.

Some success has been had in affixing ohmic connections to silicon transistor bars by electroplating the ends of the bars with rhodium or nickel and soldering a suitable connecting wire to this coating. However, the heat incident to the soldering often causes a cracking away of the contact, and sometimes damages the characteristics of the silicon bar as well.

The present invention provides a simpler, easier and quicker method for attaching electroconductive leads to the ends of silicon bars, and the attachment is accomplished without damage to the characteristics of the bars and is quite permanent.

Briefly, the present method of attaching electrical connections to the ends of the silicon bars consists in dipping the ends of the silicon bars into an alloy consisting of approximately 75% to 90% gold, approximately 25% to 10% tin, and a small percent or fraction of a percent of some conductivity-affecting material such as antimony. This alloy melts at a much lower temperature than does gold. The alloy is maintained at a temperature barely above its freezing point and the ends of the transistor bars are dipped only long enough to pick up a good coating, and not long enough to become seriously heated. The impurity, such as antimony, arsenic, aluminum or indium, is matched to the conductivity-affecting impurity in the end of the bar being coated, so that the conductivity characteristic of this end of the bar will not be changed and there will be no tendency to form a rectifying junction at the point of connection.

No solder flux is necessary for this coating if the silicon bars are clean, and the relatively small temperature changes produced in the dipping do not cause enough expansion or contraction to cause cracking. The alloy coating forms a satisfactory base for the attachment of electrical connections by the use of low-temperature solder, and thus, again, changes of temperature high enough to cause cracking are avoided.

It will immediately be apparent to those skilled in this art that numerous modifications in the method and the consequent article of this invention may be made without departing from the spirit of this invention.

Further details and advantages of the invention will be apparent from the following detailed description of the practice of the preferred embodiment thereof as illustrated in the accompanying drawing.

Figure 1:
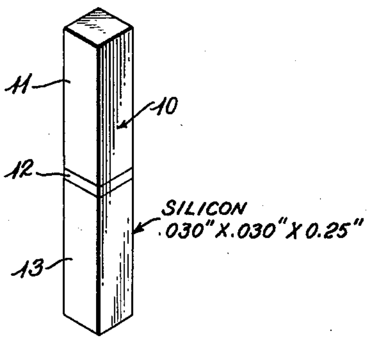
Figure 1 is a perspective view of a typical silicon transistor bar.
Figure 2:
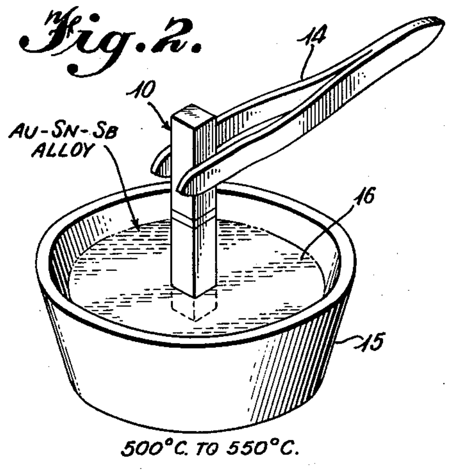
Figure 2 is a perspective view illustrating the operation of dipping one end of the silicon transistor bar into the alloy of this invention.

As previously mentioned, a typical silicon transistor bar 10 is about .030 by .030 inch in cross-section by about 0.25 inch in length, and consists of an end section 11, known as an emitter section, separated by a thin layer 12, known as the base section, from another end section 13, known as the collector section.

In accordance with this invention, silicon transistor bars such as these are first etched with an etching solution, which preferably consists of nitric acid, hydrochloric acid, acetic acid, and a few drops of bromine, then washed clean with distilled water and rinsed with alcohol and dried so as to make their surfaces quite clean. Next a small quantity of an alloy consisting of 84% gold, 15% tin and 1% antimony is melted in a small crucible and maintained therein at a temperature of between 500° C. and 600° C., and preferably just above the freezing point. The silicon bars are now picked up, one at a time, with a pair of tongs 14 and the end to be coated is dipped quickly into the crucible 15, which contains alloy 16. The tongs act to absorb heat out of the silicon bar, and the silicon bar is allowed to remain only very briefly in the alloy, usually being dipped into the alloy near the center and drawn toward the side and out. The alloy at the side of the crucible is preferably cool enough to be in the "mushy" stage and hardens on the bar almost before the bar is withdrawn. This produces rather a rough coating on the end of the bar, but this has been found to be a better practice than to allow the bar to heat up excessively. It is possible to operate at a temperature such that the alloy will coat the end of the bar smoothly, but at such temperature the tendency for the alloy to crack away from the bar increases.

Figure 3:
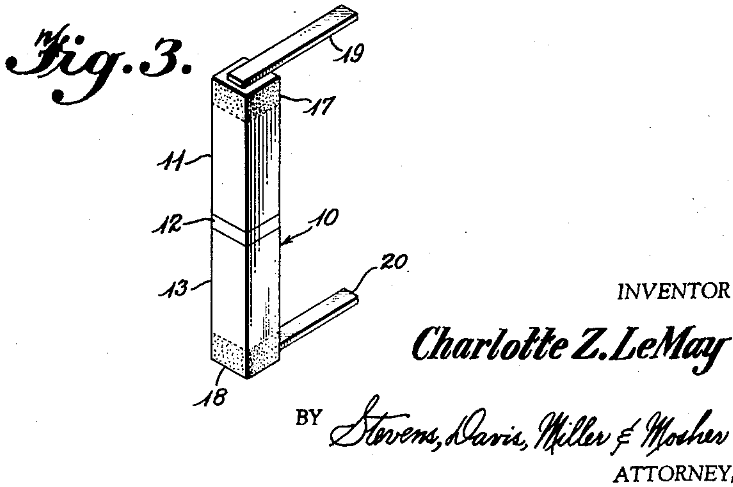
Figure 3 is a perspective view of a completed silicon bar with the two ohmic end contacts having been made.

The resultant coated bar, as shown in Figure 3, has a coating on each end at 17 and 18, and to these coated ends, wire leads 19 and 20 may be attached by means of soft (low melting point) solder.

The method of cleaning the ends of the silicon bars prior to coating is not critical, it being important only that the bars be clean and free from any material that would prevent the molten alloy from making good contact with the bars. Considerable variation in the composition of the alloy may be made, but, in general, the amount of gold should lie between approximately 75% and 90% and the remainder should be tin except for a small amount of some conductivity-affecting material. It is not absolutely essential that a conductivity-affecting material be included, but, generally, it will be desirable to include a small percent or fraction of a percent of an n-type impurity, such as antimony or arsenic, when connection is being made to n-type end portions of an n-p-n transistor bar, and it will be desirable to add a similarly small percent of some p-type impurity, such as aluminum or indium, if connection is being made to the p-type end portions of a p-n-p transistor bar. The addition of these impurities prevents the possibility of forming a rectifying junction with the bar, which of course, is not desired.

Depending upon the constitution of the alloy, the temperature at which it freezes will vary somewhat, and it has been found desirable to maintain the alloy at a temperature above but quite close to its freezing point. In fact, if the alloy is melted in a small crucible and the temperature is carefully controlled, the alloy may be caused to be molten at the center and to be in a mushy state at the edges, and this is the most desirable condition.

It is not necessary to use cesium fluoride or solder flux to cause the alloy to adhere to the silicon bars, as it appears that the alloy of this invention tends to alloy itself to a certain extent with the ends of the silicon bars, even at the low temperatures used, thus forming good, firm contacts.

In the course of attaching the final leads to the ends of the bars, any soft solder may be used, and, again, no solder flux is necessary. A solder that has been found satisfactory for this purpose is pure tin. The lead wires attached by this solder may be of copper, steel, tungsten, or one of the various iron-nickel alloys, such as Kovar, or Dumet.

What is claimed is:

1. A method of attaching an electrical connection to a silicon semiconductor element that comprises maintaining at a temperature slightly above its freezing point an alloy consisting essentially of 75% to 90% gold and 10% to 25% tin, dipping a portion of the silicon semiconductor element briefly into said alloy to allow a coating of said alloy to adhere thereto and thereafter attaching an electrical connection to the alloy adhering to the silicon semiconductor element by means of a soft solder.

2. A method of attaching an ohmic electrical connection to a silicon semiconductor element having a conductivity affecting impurity dispersed therein that comprises maintaining at a temperature slightly above its freezing point an alloy consisting essentially of gold and tin, with the gold being present to the extent of essentially 75% to 90%, said alloy containing a minor percentage of a conductivity affecting impurity of the same conductivity type as the said conductivity affecting impurity in said semiconductor element, contacting a portion of said silicon semiconductor element briefly with said molten alloy to allow a coating of said alloy to adhere thereto, and thereafter soldering an electrical connection to the coated portion of said silicon element by means of a soft solder.

3. A method of attaching an ohmic electrical connection to a silicon semiconductor element having a conductivity affecting impurity dispersed therein that comprises maintaining at a temperature slightly above its freezing point an alloy consisting of essentially 84% gold, 15% tin and 1% of a conductivity affecting impurity of the same conductivity type as the said conductivity affecting impurity in said semiconductor element, contacting a portion of said silicon semiconductor element briefly with said molten alloy to allow said alloy to coat a portion thereof, and thereafter soldering an electrical connection to the coated portion of said silicon semiconductor element by means of a soft solder.

4. A method of attaching an electrical connection to a silicon semiconductor element of the n-p-n type that comprises maintaining at a temperature slightly above its freezing point an alloy consisting essentially of 75% to 90% gold, 10% to 25% tin and a minor percentage of a material capable of causing silicon to have n-type conductivity, contacting an n-type portion of said silicon semiconductor element with said alloy to permit a portion of said alloy to adhere as a coating to said silicon semiconductor element, and thereafter attaching an electrical connection to the coated portion of said silicon semiconductor element by means of a soft solder.

5. A method of attaching an electrical connection to a silicon semiconductor element of the p-n-p type that comprises maintaining at a temperature slightly above its freezing point an alloy consisting essentially of 75% to 90% gold, 10% to 25% tin and a minor percentage of a material capable of causing silicon to have p-type conductivity, contacting a p-type portion of said silicon semiconductor element with said alloy to permit a portion of said alloy to adhere as a coating to said silicon semiconductor element, and thereafter attaching an electrical connection to the coated portion of said silicon semiconductor element by means of a soft solder.

6. A method of attaching an electrical connection to a silicon semiconductor element of the n-p-n type that comprises maintaining at a temperature slightly above its freezing point an alloy consisting essentially of 75% to 90% gold, 10% to 25% tin and a minor percentage of antimony, contacting an n-type portion of said silicon semiconductor element with said alloy to permit a portion of said alloy to adhere as a coating to said silicon semiconductor element, and thereafter attaching an electrical connection to the coated portion of said silicon semiconductor element by means of a soft solder.

References Cited in the file of this patent

UNITED STATES PATENTS

| | | |
|---|---|---|
| 1,996,657 | Shannon | Apr. 2, 1935 |
| 2,633,489 | Kinman | Mar. 31, 1953 |
| 2,662,984 | James et al. | Dec. 15, 1953 |
| 2,781,577 | Smellie | Feb. 19, 1957 |
| 2,793,420 | Johnston et al. | May 28, 1957 |